(12) United States Patent
Nie

(10) Patent No.: US 11,532,648 B2
(45) Date of Patent: Dec. 20, 2022

(54) METHOD OF MANUFACTURING DISPLAY PANEL AND DISPLAY PANEL

(71) Applicant: WUHAN CHINA STAR OPTOELECTRONICS TECHNOLOGY CO., LTD., Hubei (CN)

(72) Inventor: Xiaohui Nie, Wuhan (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 149 days.

(21) Appl. No.: 16/771,382

(22) PCT Filed: Apr. 10, 2020

(86) PCT No.: PCT/CN2020/084285
§ 371 (c)(1),
(2) Date: Jun. 10, 2020

(87) PCT Pub. No.: WO2021/189556
PCT Pub. Date: Sep. 30, 2021

(65) Prior Publication Data
US 2022/0115415 A1    Apr. 14, 2022

(30) Foreign Application Priority Data
Mar. 27, 2020   (CN) ......................... 202010229682.9

(51) Int. Cl.
*H01L 27/00*   (2006.01)
*H01L 27/12*   (2006.01)

(52) U.S. Cl.
CPC ...... *H01L 27/1248* (2013.01); *H01L 27/1218* (2013.01); *H01L 27/1262* (2013.01)

(58) Field of Classification Search
CPC ............ H01L 27/1248; H01L 27/1218; H01L 27/1262
See application file for complete search history.

(56) References Cited

U.S. PATENT DOCUMENTS 9,768,196 B2    9/2017   Zang
11,049,885 B2 *  6/2021   Zhang ............... G02F 1/133305
(Continued)

FOREIGN PATENT DOCUMENTS

CN   104103648 A   10/2014
CN   104216153 A   12/2014
(Continued)

*Primary Examiner* — Nikolay K Yushin
(74) *Attorney, Agent, or Firm* — PV IP PC; Wei Te Chung; Ude Lu

(57) ABSTRACT

A method of manufacturing a display panel and a display panel are provided. A groove is formed on a buffer layer through performing exposure and etching processes, so as to divide the buffer layer into independent units. A gate insulating layer, a dielectric layer, and a passivation layer are converted from continuous layers to independent layers on the buffer layer. Therefore, heterogeneous interface stress accumulated in the independent unit is reduced, it prevents the deformation of the glass substrate, protects the glass substrate, reduces fragmentation phenomenon, and improves process reliability and yield.

8 Claims, 3 Drawing Sheets

(56) References Cited

U.S. PATENT DOCUMENTS

2003/0222334 A1  12/2003 Ikeda
2014/0097429 A1   4/2014 Kim
2016/0026019 A1   1/2016 Choi
2020/0328234 A1* 10/2020 Zhang .................. G02F 1/1362

FOREIGN PATENT DOCUMENTS

CN      105278172 A    1/2016
CN      108899326 A   11/2018
CN      109659315 A    4/2019

* cited by examiner

METHOD OF MANUFACTURING DISPLAY PANEL AND DISPLAY PANEL

CROSS REFERENCE

The present application is a U.S. National Stage of International Patent Application No. PCT/CN2020/084285 filed on Apr. 10, 2020, which claims priority to Chinese Patent Application No. 202010229682.9, filed on Mar. 27, 2020, filed for the invention titled "Method of Manufacturing Display Panel and Display Panel, which is hereby incorporated by reference in its entirety.

BACKGROUND OF INVENTION

Field of Invention

The present invention relates to the field display technology, and more particularly, to a method of manufacturing a display panel and a display panel.

Description of Prior Art

Display devices can display various words, numbers, symbols, or intuitive images, which are data transformed by computers, and the display devices use keyboard and other tools to command or input data into the computers. With the help of the system's hardware and software, people can add, delete, or change the display contents at any time. The display devices are classified into plasma, liquid crystal, light emitting diode, and cathode ray tube types.

Low temperature polysilicon thin film transistors (LTPS-TFTs) have outstanding advantages of high carrier mobility and small size. It is a key technology for the development of low power consumption and highly integrated display panels. The structure of the LTPS display panels is similar to the sandwich model, which is formed by stacking layers with different functions. These layers are made of inorganic materials including SiNx, SiOx, Poly-Si, metal materials including Mo, Ti/Al/Ti alloys, and high molecular polymers.

Due to high-temperature process involved in the manufacturing the display panels processes, lattice constants and thermal expansion coefficients of different materials are different. Therefore, after finishing the high temperature process, there are differences in the scales of the thermal expansion and contraction of the layers made of different materials. The stress accumulation in the horizontal direction and the vertical direction causes warpage and deformation of the glass substrate, resulting in chipping of the glass substrate. Heterogeneous interfacial stress is related to film thickness and film area. The larger the film thickness, the larger the film area. The greater the heterogeneous interface stress, the greater the degree of warpage and deformation of the glass substrate. Thus, risk of glass substrate fragmentation is higher.

The design of a common photomask for multiple display panels is an effective measure to reduce development costs and increase the utilization of glass substrates. Multiple display panels are mixed and arranged on the same glass substrate. After depositing the thin films in the connection area between two adjacent display panels, the thermal expansion coefficients of different layers are different. After the high-temperature process, there is a large heterogeneous interfacial stress between different layers, resulting in deformation or even chipping of the glass substrate, and the process reliability is greatly reduced. Therefore, a new method of manufacturing a display panel is needed so as to solve the above problems.

SUMMARY OF INVENTION

An object of the present invention is to provide a method of manufacturing a display panel and a display panel, which can solve the heterogeneity between the layers of the connection area between two adjacent display panels in the method of manufacturing the display panel in the prior art, which results that the glass substrate is prone to deformation or chipping, so as to cause low process reliability and low yield.

In order to solve the above-mentioned problems, a method of manufacturing a display panel comprises following steps of:

providing a glass substrate, and the glass substrate comprises at least two display areas and a connection area between two adjacent display panel areas;

forming a buffer layer on the glass substrate;

forming at least one groove on the buffer layer of the connection area; and forming at least one layer on the buffer layer, and the at least one layer extends into the groove.

In one embodiment, before step of the forming the buffer layer on the glass substrate, wherein the method further comprises:

forming a metal shielding layer on the glass substrate, and the buffer layer is formed on the glass substrate and the metal shielding layer.

In one embodiment, the forming at least one layer on the buffer layer comprises:

forming a gate insulating layer on an upper surface of the buffer layer;

forming a dielectric layer on an upper surface of the gate insulating layer; and forming a passivation layer on an upper surface of the dielectric layer.

In one embodiment, before step of the forming the gate insulating layer on the upper surface of the buffer layer, wherein the method further comprises:

forming a polysilicon layer on the buffer layer; and after the forming the gate insulating layer on the upper surface of the buffer layer, the method further comprises:

forming a gate electrode layer on the gate insulating layer.

In one embodiment, after step of the forming the dielectric layer on the upper surface of the gate insulating layer, the method further comprises:

forming a source-drain layer and a common electrode layer on the dielectric layer.

In one embodiment, after step of the forming the passivation layer on the upper surface of the dielectric layer, the method further comprises:

forming a pixel electrode layer on the passivation layer.

In one embodiment, after step of the forming the at least one layer on the buffer layer, the method further comprises:

performing exposure and etching processes to remove portions of the passivation layer and the dielectric layer corresponding to the groove; and forming an opening area penetrating the passivation layer and the dielectric layer.

In one embodiment, a depth of the opening area ranges from 0.8 to 1.1 µm; and/or a width of the opening area ranges from 1.5 to 2.5 µm.

In one embodiment, a longitudinal section of the groove comprises a rectangular shape or a trapezoidal shape.

In one embodiment, the method comprises:

providing a glass substrate, wherein the glass substrate comprises at least two display areas and a connection area between two adjacent display panel areas;

forming a buffer layer on the glass substrate;

forming at least one groove on the buffer layer of the connection area; and forming at least one layer on the buffer layer, and the at least one layer extends into the groove.

In one embodiment, before step of the forming the buffer layer on the glass substrate, and the method further comprises:

forming a metal shielding layer on the glass substrate, and the buffer layer is formed on the glass substrate and the metal shielding layer.

In one embodiment, the forming at least one layer on the buffer layer comprises:

forming a gate insulating layer on an upper surface of the buffer layer;

forming a dielectric layer on an upper surface of the gate insulating layer; and forming a passivation layer on an upper surface of the dielectric layer.

In one embodiment, before step of the forming the gate insulating layer on the upper surface of the buffer layer, and the method further comprises:

forming a polysilicon layer on the buffer layer; and after the forming the gate insulating layer on the upper surface of the buffer layer, the method further comprises:

forming a gate electrode layer on the gate insulating layer.

In one embodiment, after step of the forming the dielectric layer on the upper surface of the gate insulating layer, the method further comprises:

forming a source-drain layer and a common electrode layer on the dielectric layer.

In one embodiment, after step of the forming the passivation layer on the upper surface of the dielectric layer, the method further comprises:

forming a pixel electrode layer on the passivation layer.

In one embodiment, after step of the forming the at least one layer on the buffer layer, the method further comprises:

performing exposure and etching processes to remove portions of the passivation layer and the dielectric layer corresponding to the groove; and forming an opening area penetrating the passivation layer and the dielectric layer.

In one embodiment, a depth of the opening area ranges from 0.8 to 1.1 μm; and/or a width of the opening area ranges from 1.5 to 2.5 μm.

In one embodiment, a longitudinal section of the groove comprises a rectangular shape or a trapezoidal shape.

The present invention has beneficial effects described as follows. A method of manufacturing a display panel and a display panel are provided. A groove is formed on a buffer layer through performing exposure and etching processes, so as to divide the buffer layer into independent units. A gate insulating layer, a dielectric layer, and a passivation layer are converted from continuous layers to independent layers on the buffer layer. Therefore, heterogeneous interface stress accumulated in the independent unit is reduced, it prevents the deformation of the glass substrate, protects the glass substrate, reduces fragmentation phenomenon, and improves process reliability and yield.

BRIEF DESCRIPTION OF DRAWINGS

In order to more clearly illustrate the technical solutions in the embodiments, the drawings described in the description of the embodiments are briefly described below. It is obvious that the drawings in the following description are only some embodiments of the present invention. Other drawings can also be obtained from those skilled persons in the art based on drawings without any creative effort.

Figure 1:
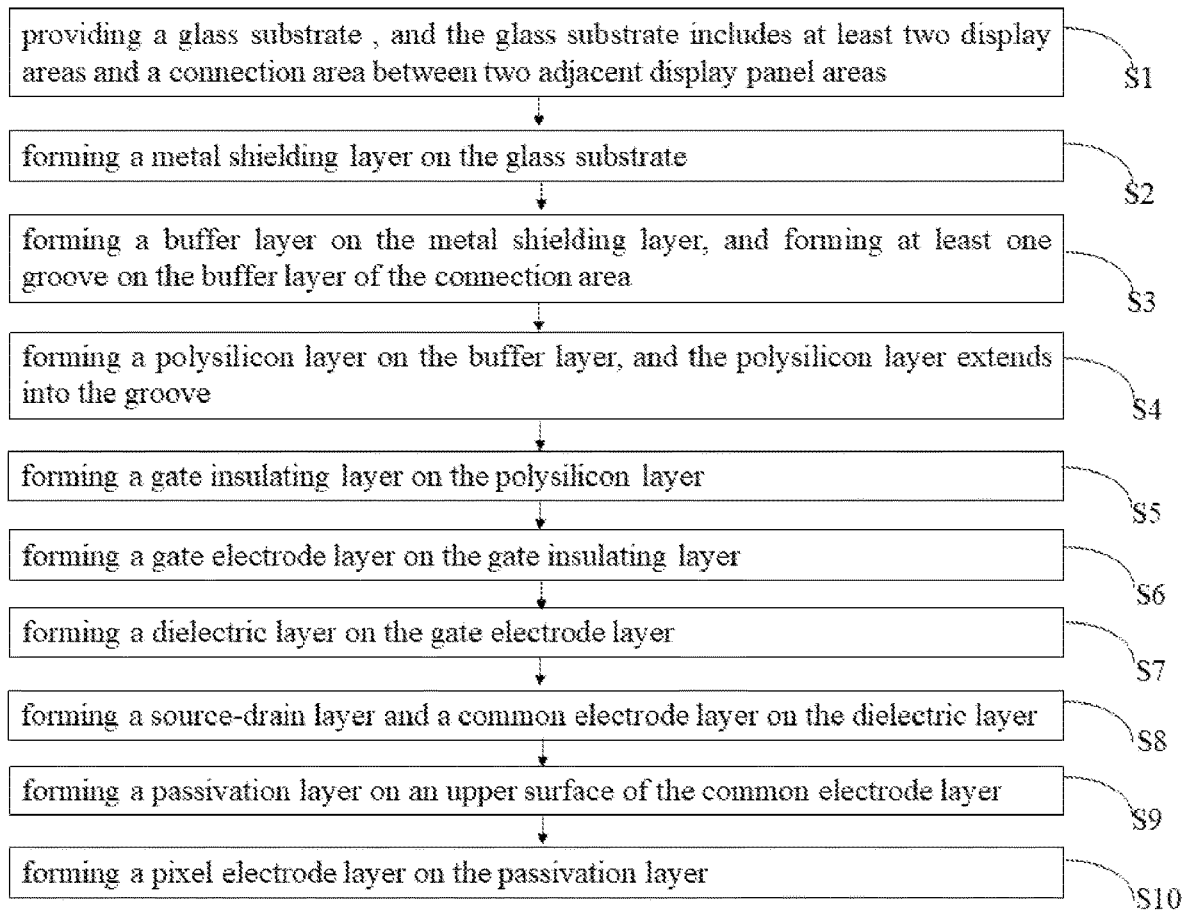
FIG. 1 is a view of steps of manufacturing a display panel.

Reference numerals:

glass substrate 1; display area 2: connection area 3; groove 4; opening area 5; metal shielding layer 301; buffer layer 31; polysilicon layer 302; gate insulating layer 32; gate electrode layer 303; dielectric layer 33; source-drain layer 304; common electrode layer 305; passivation layer 34; and pixel electrode layer 306.

DETAILED DESCRIPTION OF PREFERRED EMBODIMENTS

The preferred embodiments of the present invention are described in detail below with reference to the accompanying drawings. Those skilled persons in the art will easily understand how to implement the invention. The invention can be implemented by the embodiments, so that the technical content of the disclosure will be clear, so that those skilled persons in the art will understand how to implement the invention. The present invention may be accomplished in many different embodiments, and the scope of the invention is not limited to the embodiments described herein.

Directional terms mentioned in this application, such as "up," "down," "forward," "backward," "left," "right," "inside," "outside," "side," etc., are merely indicated the direction of the drawings. Therefore, the directional terms are used for illustrating and understanding of the application rather than limiting thereof.

In the drawings, identical components are marked with the same reference numerals, and structural or components having similar functions are marked with similar reference numerals. Moreover, the size and thickness of each component shown in the drawings are arbitrarily shown for understanding and describing, and the invention does not limit the size and thickness of each component.

Figure 2:
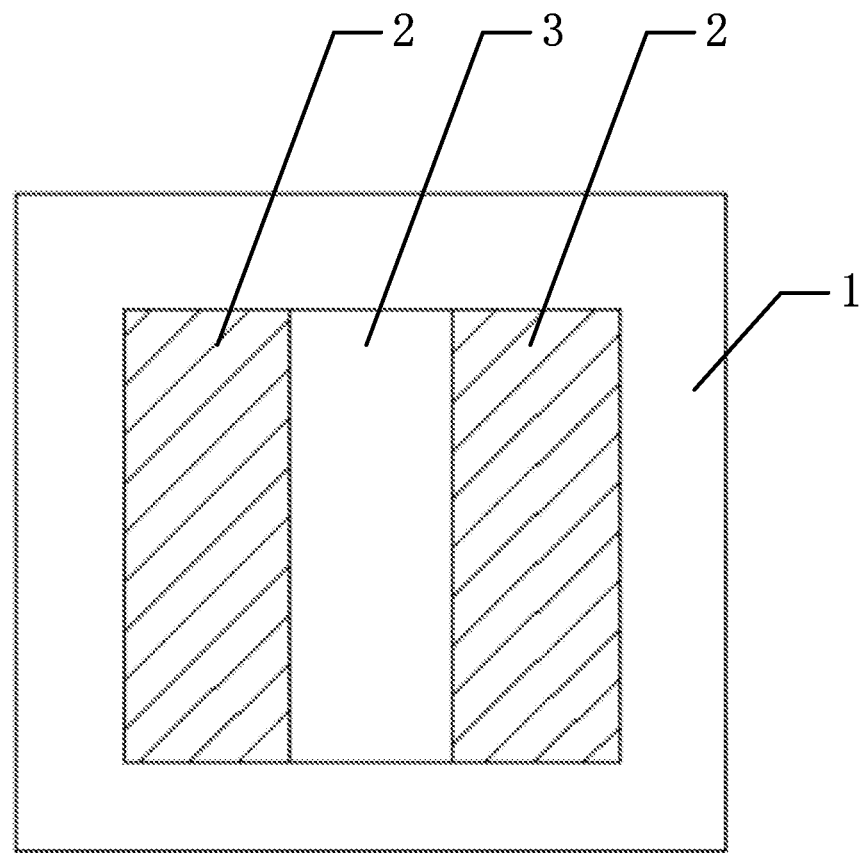
FIG. 2 is a schematic plan view of a semi-finished product of the display panel.
Figure 4:
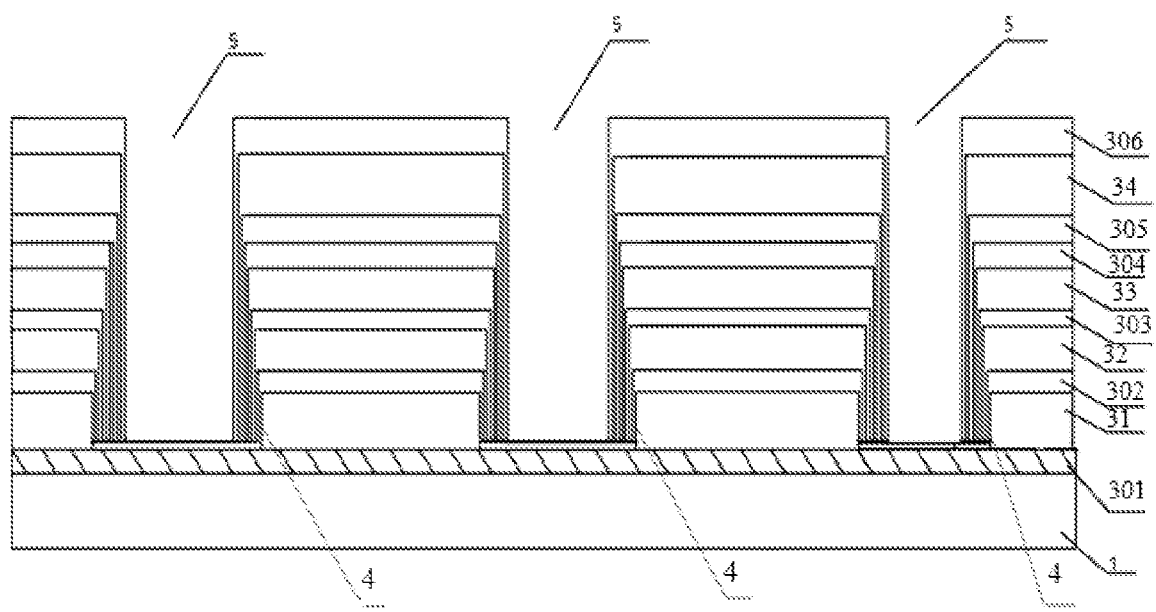
FIG. 4 is a schematic structural view of a display panel.

When a component is described as "on" another component, the component can be disposed directly on the other component. Also, one component is disposed on an intermediate component, and the intermediate component is disposed on another component. When a component is described as "installed" or "connected" to another component, it can be understood as directly "installed" or "connected" to another component. In first embodiment, referring to FIG. 1, FIG. 2, and FIG. 4, a method of manufacturing a display panel includes: step S1, providing a glass substrate 1, and the glass substrate 1 includes at least two display areas 2 and a connection area 3 between two adjacent display panel areas; step S2, forming a metal shielding layer 301 on the glass substrate 1; step S3, forming a buffer layer 31 on the metal shielding layer 301, and forming at least one groove 4 on the buffer layer 31 of the connection area 3; step S4, forming a polysilicon layer 302 on the buffer layer 31, and the polysilicon layer 302 extends into the groove 4; step S5, forming a gate insulating layer 32 on the polysilicon layer 302; step S6, forming a gate electrode layer 303 on the gate insulating layer 32; step S7, forming a dielectric layer 33 on the gate electrode layer 303;

step S8, forming a source-drain layer 304 and a common electrode layer 305 on the dielectric layer 33; step S9, forming a passivation layer 34 on an upper surface of the common electrode layer 305; and step 10, forming a pixel electrode layer 306 on the passivation layer 34.

In step S3, at least one groove 4 is formed on the buffer layer 31 of the connection area 3 through exposure and etching processes. The longitudinal section of the groove 4 includes a rectangular shape or a trapezoidal shape.

The high-temperature process is involved in the manufacturing the display panels processes, and the passivation layer 34, the dielectric layer 33, the gate insulating layer 32, and the buffer layer 31 of the connection area 3 are made different materials, so lattice constants and thermal expansion coefficients of different materials are different. Therefore, after finishing the high temperature process, there are differences in the scales of the thermal expansion and contraction of the layers made of different materials. The stress accumulation in the horizontal direction and the vertical direction causes warpage and deformation of the glass substrate 1, resulting in chipping of the glass substrate 1. Heterogeneous interfacial stress is related to film thickness and film area. The larger the film thickness, the larger the film area. The greater the heterogeneous interface stress, the greater the degree of warpage and deformation of the glass substrate 1. Thus, risk of glass substrate 1 fragmentation is higher. Therefore, the buffer layer 31 is divided into independent units, so the gate insulating layer 32, the dielectric layer 33, and the passivation layer 34 on the buffer layer 31 are converted from continuous layers to independent layers on the buffer layer 31, thereby reducing area of the gate insulating layer 32, the dielectric layer 33, and the passivation layer 34. Accordingly, heterogeneous interface stress accumulated in the independent unit is reduced, it prevents the deformation of the glass substrate 1, protects the glass substrate 1, reduces fragmentation phenomenon, and improves process reliability and yield.

The method of manufacturing the display panel further includes performing exposure and etching processes to remove portions of the passivation layer 34 and the dielectric layer 33 corresponding to the groove 4; and forming an opening area 5 penetrating the passivation layer 34 and the dielectric layer 33.

A depth of the opening area 5 ranges from 0.8 to 1.1 μm. The depth of the opening area 5 may be selected from 0.8 μm, 0.9 μm, 1.0 μm, and 1.1 μm. In this embodiment, the depth of the opening area 5 is preferably 1.0 μm.

The width of the opening area 5 is 1.5-2.5 μm. The width of the opening area 5 may be selected from 1.5 μm, 1.7 μm, 1.9 μm, 2.1 μm, 2.3 μm, and 2.5 μm. In this embodiment, the width of the opening area 5 is preferably 2.1 μm.

In another embodiment, a display panel is provided. The display panel is manufactured by the above-mentioned method.

Figure 3:
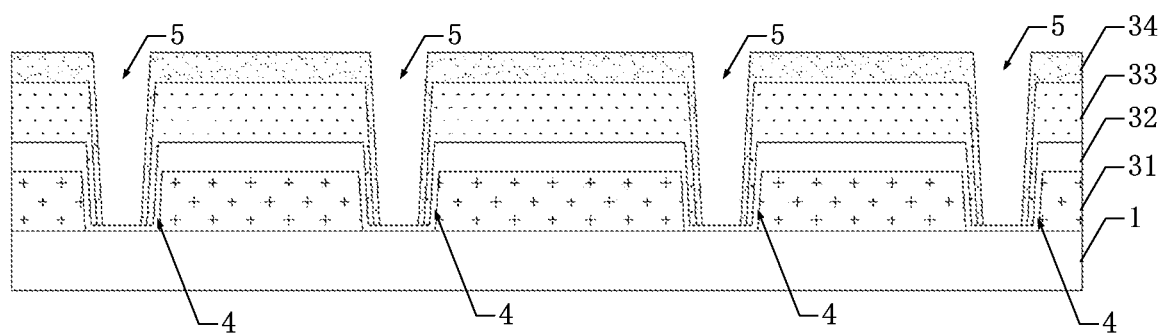
FIG. 3 is a schematic structural view of a connection area of the display panel.

Referring to FIG. 3, the connection area 3 between the adjacent display panel areas includes a buffer layer 31, a gate insulating layer 32, a dielectric layer 33, and a passivation layer 34. The metal shielding layer 301, polysilicon layer 302, gate electrode layer 303, a source-drain layer 304, a common electrode layer 305, and a pixel electrode layer 306 in the display area 2 are formed by patterning process, so the metal shielding layer 301, the polysilicon layer 302, the gate electrode layer 303, the source-drain layer 304, the common electrode layer 305, and the pixel electrode layer 306 of the connection area are etched at the same time.

The buffer layer 31 is disposed on the glass substrate 1. The buffer layer 31 plays a role in buffer action and can also be used to block moisture. The buffer layer 31 is mainly made of inorganic material. Specifically, the inorganic material includes one or more of SiNx and SiOx.

The gate insulating layer 32 is disposed on the buffer layer 31. The gate insulating layer 32 is mainly made of an inorganic material. Specifically, the inorganic material includes one or more of SiNx and SiOx.

The dielectric layer 33 is disposed on the gate insulating layer 32. The dielectric layer 33 is mainly made of an inorganic material. Specifically, and the inorganic material includes one or more of SiNx and SiOx.

The passivation layer 34 is disposed on the dielectric layer 33. The passivation layer 34 is mainly made of an inorganic material. Specifically, and the inorganic material includes one or more of SiNx and SiOx.

In the above, the present application has been described in the above preferred embodiments, but the preferred embodiments are not intended to limit the scope of the invention, and a person skilled in the art may make various modifications without departing from the spirit and scope of the application. The scope of the present application is determined by claims.

What is claimed is:

1. A method of manufacturing a display panel, comprising following steps of:
   providing a glass substrate, wherein the glass substrate comprises at least two display areas and a connection area between two adjacent display panel areas;
   forming a metal shielding layer on the glass substrate in the at least two display areas;
   forming a buffer layer on the glass substrate in the connection area and the metal shielding layer in the at least two display areas;
   forming at least one groove on the buffer layer of the connection area; and
   forming at least one layer on the buffer layer, wherein the at least one layer extends into the groove.

2. The method of manufacturing the display panel according to claim 1, wherein a longitudinal section of the groove comprises a rectangular shape or a trapezoidal shape.

3. The method of manufacturing the display panel according to claim 1, wherein the forming at least one layer on the buffer layer comprises:
   forming a gate insulating layer on an upper surface of the buffer layer;
   forming a dielectric layer on an upper surface of the gate insulating layer; and
   forming a passivation layer on an upper surface of the dielectric layer.

4. The method of manufacturing the display panel according to claim 3, before step of the forming the gate insulating layer on the upper surface of the buffer layer, wherein the method further comprises:
   forming a polysilicon layer on the buffer layer; and
   after the forming the gate insulating layer on the upper surface of the buffer layer, the method further comprises:
   forming a gate electrode layer on the gate insulating layer.

5. The method of manufacturing the display panel according to claim 3, after step of the forming the dielectric layer on the upper surface of the gate insulating layer, the method further comprises:
   forming a source-drain layer and a common electrode layer on the dielectric layer.

6. The method of manufacturing the display panel according to claim 3, after step of the forming the passivation layer on the upper surface of the dielectric layer, the method further comprises:
   forming a pixel electrode layer on the passivation layer.

7. The method of manufacturing the display panel according to claim 3, after step of the forming the at least one layer on the buffer layer, the method further comprises:
   performing exposure and etching processes to remove portions of the passivation layer and the dielectric layer corresponding to the groove; and
   forming an opening area penetrating the passivation layer and the dielectric layer.

8. The method of manufacturing the display panel according to claim 7, wherein a depth of the opening area ranges from 0.8 to 1.1 µm; and/or a width of the opening area ranges from 1.5 to 2.5 µm.

* * * * *